(12) United States Patent
Au et al.

(10) Patent No.: US 6,546,461 B1
(45) Date of Patent: Apr. 8, 2003

(54) MULTI-PORT CACHE MEMORY DEVICES AND FIFO MEMORY DEVICES HAVING MULTI-PORT CACHE MEMORY DEVICES THEREIN

(75) Inventors: Mario Au, Fremont, CA (US); Li-Yuan Chen, Cupertino, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 123 days.

(21) Appl. No.: 09/721,478

(22) Filed: Nov. 22, 2000

(51) Int. Cl.⁷ .............................. G06F 12/08; G11C 7/10
(52) U.S. Cl. ...................... 711/131; 711/120; 710/52; 365/189.02
(58) Field of Search ................................. 711/119, 120, 711/131, 149; 710/52, 53; 365/189.02, 189.04, 189.05, 230.05

(56) References Cited

U.S. PATENT DOCUMENTS

| | | | |
|---|---|---|---|
| 4,195,340 A | 3/1980 | Joyce | 364/200 |
| 4,402,067 A | 8/1983 | Moss et al. | 365/219 |
| 4,577,293 A | 3/1986 | Matick et al. | 365/189 |
| 4,731,758 A | 3/1988 | Lam et al. | 365/189 |
| 4,758,987 A | 7/1988 | Sakui | 365/189 |
| 4,823,321 A | 4/1989 | Aoyama | 365/189 |
| 4,829,471 A | 5/1989 | Banerjee et al. | 364/900 |
| 4,837,746 A | 6/1989 | Banerjee et al. | 365/189.05 |
| 4,849,935 A | 7/1989 | Miyazawa | 365/189.05 |
| 4,894,770 A | 1/1990 | Ward et al. | 364/200 |
| 5,025,421 A | 6/1991 | Cho | 365/230.05 |
| 5,046,000 A | 9/1991 | Hsu | 364/200 |
| 5,226,009 A | 7/1993 | Arimoto | 365/189.04 |
| 5,226,147 A | 7/1993 | Fujishima et al. | 395/425 |
| 5,249,282 A | 9/1993 | Segers | 395/425 |
| 5,269,009 A | 12/1993 | Herzl et al. | 395/425 |
| 5,276,842 A | 1/1994 | Sugita | 395/425 |
| 5,280,441 A | 1/1994 | Wada et al. | 365/63 |
| 5,365,485 A | 11/1994 | Ward et al. | 365/221 |
| 5,371,877 A | 12/1994 | Drako et al. | 395/425 |
| 5,434,818 A * | 7/1995 | Byers et al. | 365/189.04 |
| 5,546,347 A | 8/1996 | Ko et al. | 365/221 |
| 5,557,733 A | 9/1996 | Hicok et al. | 395/162 |
| 5,561,781 A | 10/1996 | Braceras et al. | 395/458 |
| 5,586,299 A | 12/1996 | Wakerly | 711/149 |
| 5,603,009 A | 2/1997 | Konishi et al. | 395/492 |
| 5,642,318 A | 6/1997 | Knaack et al. | 365/201 |
| 5,663,910 A | 9/1997 | Ko et al. | 365/189.05 |
| 5,671,393 A | 9/1997 | Yamaki et al. | 395/477 |
| 5,682,356 A | 10/1997 | Knaack | 365/236 |
| 5,712,820 A | 1/1998 | Knaack | 365/189.02 |
| 5,715,197 A | 2/1998 | Nance et al. | 365/189.04 |
| 5,732,041 A | 3/1998 | Joffe | 365/230.05 |
| 5,751,638 A | 5/1998 | Mick et al. | 365/189.04 |

(List continued on next page.)

Primary Examiner—Gary J Portka
(74) Attorney, Agent, or Firm—Myers Bigel Sibley & Sajovec

(57) ABSTRACT

A FIFO memory device includes an embedded memory array having a write port and a read port and a quad-port cache memory device. The cache memory device has a unidirectional data input port, a unidirectional data output port, a first embedded memory port that is electrically coupled to the write port and a second embedded memory port that is electrically coupled to the read port. A data input register, a retransmit register, a data output register and a multiplexer are provided within the cache memory device. The data input register is responsive to a write address and has a data input electrically coupled to the data input port and a data output electrically coupled to the first embedded memory port. The retransmit register is responsive to a retransmit address and has a data input electrically coupled to the data input port. The multiplexer is responsive to at least one path select signal and has a first input electrically coupled to the data output of the data input register, a second input electrically coupled to the second embedded memory port and a third input electrically coupled to a data output of the retransmit register. The data output register is responsive to a read address and has a data input electrically coupled to an output of the multiplexer and a data output electrically coupled to the data output port.

35 Claims, 10 Drawing Sheets

U.S. PATENT DOCUMENTS

| | | | |
|---|---|---|---|
| 5,764,967 A | 6/1998 | Knaack | 395/555 |
| 5,777,944 A | 7/1998 | Knaack et al. | 365/230.06 |
| 5,784,382 A | 7/1998 | Byers et al. | 371/22.3 |
| 5,829,015 A | 10/1998 | Macno | 365/230.05 |
| 5,852,608 A | 12/1998 | Csoppenszky et al. | 370/465 |
| 5,867,672 A * | 2/1999 | Wang et al. | 710/307 |
| 5,946,261 A | 8/1999 | Artieri | 365/230.05 |
| 5,956,748 A | 9/1999 | New | 711/149 |
| 5,978,307 A | 11/1999 | Proebsting et al. | 365/230.05 |
| 5,982,700 A | 11/1999 | Proebsting | 365/230.05 |
| 5,999,478 A | 12/1999 | Proebsting | 365/230.05 |
| 6,044,416 A * | 3/2000 | Hasan | 710/52 |
| 6,075,931 A | 6/2000 | Panwar | 395/500.02 |
| 6,088,744 A | 7/2000 | Hill | 710/53 |
| 6,091,260 A | 7/2000 | Shamarao | 326/27 |
| 6,114,840 A | 9/2000 | Farrell et al. | 322/374 |
| 6,147,926 A | 11/2000 | Park | 365/233 |
| 6,151,273 A | 11/2000 | Iwamoto et al. | 365/233 |
| 6,154,418 A | 11/2000 | Li | 365/233 |
| 6,154,419 A | 11/2000 | Shakkarwar | 365/235 |
| 6,172,927 B1 * | 1/2001 | Taylor | 365/219 |
| 6,202,139 B1 * | 3/2001 | Witt et al. | 711/169 |
| 6,216,205 B1 * | 4/2001 | Chin et al. | 711/131 |
| 6,259,652 B1 | 7/2001 | Heyne et al. | 365/700 |
| 6,263,410 B1 | 7/2001 | Kao et al. | 711/156 |
| 6,269,413 B1 | 7/2001 | Sherlock | 710/52 |
| 6,327,642 B1 * | 12/2001 | Lee et al. | 711/120 |
| 6,330,636 B1 | 12/2001 | Bondurant et al. | 711/105 |
| 6,337,809 B1 | 1/2002 | Kim et al. | 365/189.05 |
| 6,337,830 B1 | 1/2002 | Faue | 365/230.04 |
| 6,339,558 B1 | 1/2002 | Ioki | 365/221 |
| 6,381,194 B2 | 4/2002 | Li | 365/233 |

* cited by examiner

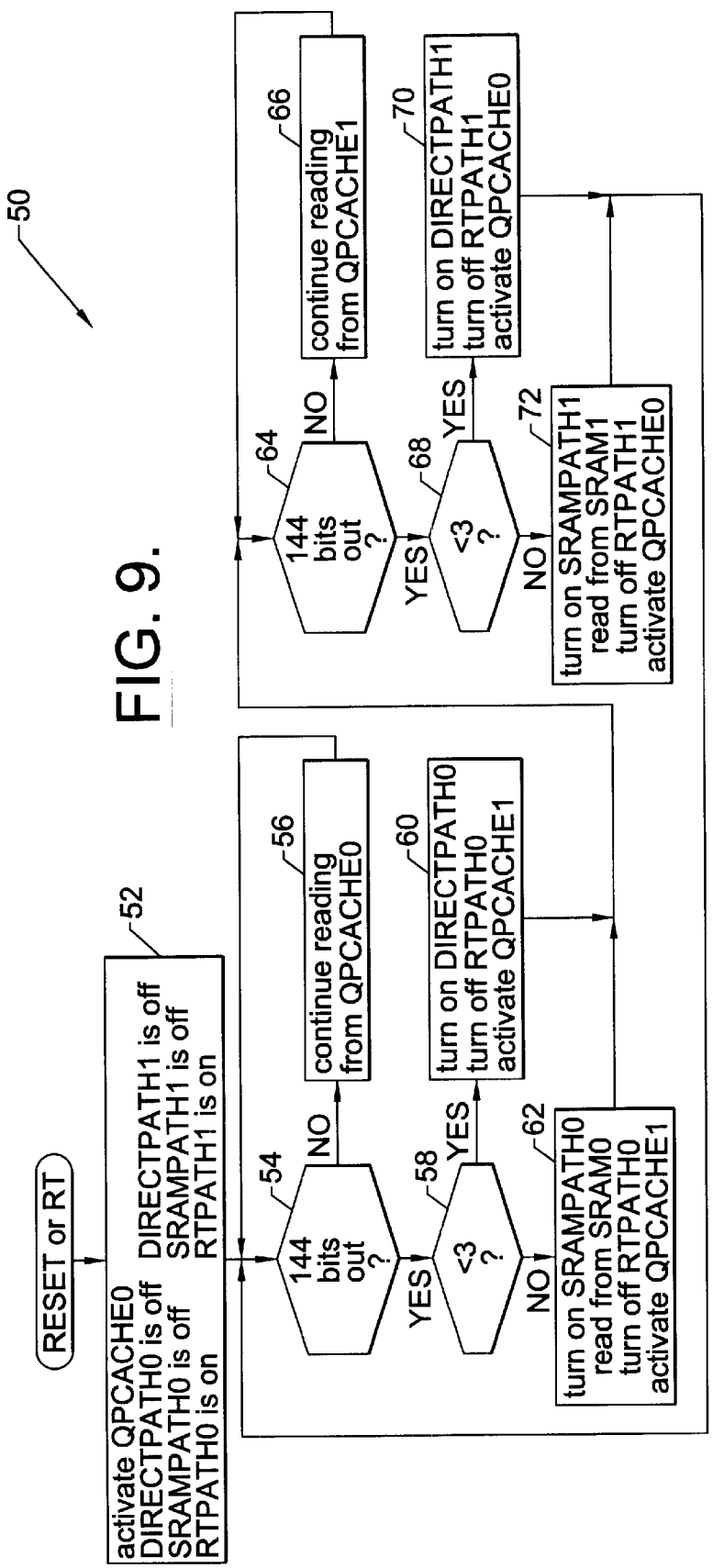

MULTI-PORT CACHE MEMORY DEVICES AND FIFO MEMORY DEVICES HAVING MULTI-PORT CACHE MEMORY DEVICES THEREIN

FIELD OF THE INVENTION

The present invention relates to integrated circuit memory devices and methods of operating same, and more particularly to buffer memory devices and methods of operating buffer memory devices.

BACKGROUND OF THE INVENTION

Semiconductor memory devices can typically be classified on the basis of memory functionality, data access patterns and the nature of the data storage mechanism. For example, distinctions are typically made between read-only memory (ROM) devices and read-write memory (RWM) devices. The RWM devices typically have the advantage of offering both read and write functionality with comparable data access times. Typically, in RWM devices, data is stored either in flip-flops for "static" memory devices or as preset levels of charge on a capacitor in "dynamic" memory devices. As will be understood by those skilled in the art, static memory devices retain their data as long as a supply of power is maintained, however, dynamic memory devices require periodic data refreshing to compensate for potential charge leakage. Because RWM devices use active circuitry to store data, they belong to a class of memory devices known as "volatile" memory devices because data stored therein will be lost upon termination of the power supply. ROM devices, on the other hand, may encode data into circuit topology (e.g., by blowing fuses, removing diodes, etc.). Since this latter type of data storage may be hardwired, the data cannot be modified, but can only be read. ROM devices also typically belong to a class of memory devices known as "nonvolatile" memory devices because data stored therein will typically not be lost upon termination of the power supply. Other types of memory devices that have been more recently developed are typically referred to as nonvolatile read-write (NVRWM) memory devices. These types of memory devices include EPROM (erasable programmable read-only memory), $E^2PROM$ (electrically erasable programmable read-only memory), and flash memories, for example.

An additional memory classification is typically based on the order in which data can be accessed. Here, most memory devices belong to the random-access class, which means that memory locations can be read from or written to in random order. Notwithstanding the fact that most memory devices provide random-access, typically only random-access RWM memories use the acronym RAM. Alternatively, memory devices may restrict the order of data access to achieve shorter data access times, reduce layout area and/or provide specialized functionality. Examples of such specialized memory devices include buffer memory devices such as first-in first-out (FIFO) memory devices, last-in first-out (LIFO or "stack") memory devices, shift registers and content-addressable memory (CAM) devices.

A final classification of semiconductor memories is based on the number of data input and data output ports associated with the memory cells therein. For example, although most memory devices have unit cells therein that provide only a single port which is shared to provide an input and output path for transfer of data, memory devices with higher bandwidth requirements often have cells therein with multiple input and output ports. However, the addition of ports to unit memory cells typically increases the complexity and layout area requirements for these higher bandwidth memory devices.

Single-port memory devices are typically made using static RAM cells if fast data access times are a requirement, and dynamic RAM cells if low cost is a primary requirement. Many FIFO memory devices use dual-port RAM based designs with self-incrementing internal read and write pointers to achieve fast fall-through capability. As will be understood by those skilled in the art, fall-through capability is typically measured as the time elapsing between the end of a write cycle into a previously empty FIFO and the time an operation to read that data may begin. Exemplary FIFO memory devices are more fully described and illustrated at section 2.2.7 of a textbook by A. K. Sharma entitled "Semiconductor Memories: Technology, Testing and Reliability", IEEE Press (1997).

In particular, dual-port SRAM-based FIFOs typically utilize separate read and write pointers to advantageously allow read and write operations to occur independently of each other and achieve fast fall-through capability since data written into a dual-port SRAM FIFO can be immediately accessed for reading. Since these read and write operations may occur independently, independent read and write clocks having different frequencies may be provided to enable the FIFO to act as a buffer between peripheral devices operating at different rates. Unfortunately, a major disadvantage of typical dual-port SRAM-based FIFOs is the relatively large unit cell size for each dual-port SRAM cell therein. Thus, for a given semiconductor chip size, dual-port buffer memory devices typically provide less memory capacity relative to single-port buffer memory devices. For example, using a standard DRAM cell as a reference unit cell consuming one (1) unit of area, a single-port SRAM unit cell typically may consume four (4) units of area and a dual-port SRAM unit cell typically may consume sixteen (16) units of area. Moreover, the relatively large unit cells of a dual-port SRAM FIFO limit the degree to which the number of write operations can exceed the number of read operations, that is, limit the capacity of the FIFO.

To address these limitations of dual-port buffer memory devices, single-port buffer memory devices have been developed to, among other things, achieve higher data capacities for a given semiconductor chip size. For example, U.S. Pat. No. 5,546,347 to Ko et al. entitled "Interleaving Architecture And Method For A High Density FIFO", assigned to the present assignee, discloses a memory device which has high capacity and uses relatively small single-port memory cells. However, the use of only single port memory cells typically precludes simultaneous read and write access to data in the same memory cell, which means that single-port buffer memory devices typically have slower fall-through time than comparable dual-port memory devices. Moreover, single-port buffer memory devices may use complicated arbitration hardware to control sequencing and queuing of reading and writing operations.

U.S. Pat. No. 5,371,708 to Kobayashi also discloses a FIFO memory device containing a single-port memory array, a read data register for holding read data from the memory array and a write data register for holding write data to the memory array. A bypass switch is also provided for transferring data from the write data register to the read data register so that the memory array can be bypassed during testing of the FIFO to detect the presence of defects therein. However, like the above-described single-port buffer memory devices, simultaneous read and write access to data is not feasible.

Commonly assigned U.S. Pat. Nos. 5,978,307, 5,982,700 and 5,999,478 disclose memory buffers having fast fall-through capability. These memory buffers contain a tri-port memory array of moderate capacity having nonlinear columns of tri-port cells therein which collectively form four separate registers, and a substantially larger capacity supplemental memory array (e.g., DRAM array) having cells therein with reduced unit cell size. The tri-port memory array has a read port, a write port and a bidirectional input/output port. The tri-port memory array communicates internally with the supplemental memory array via the bidirectional input/output port and communicates with external devices (e.g., peripheral devices) via the read and write data ports. Efficient steering circuitry is also provided by a bidirectional crosspoint switch that electrically couples terminals (lines IO and IOB) of the bidirectional input/output port in parallel to bit lines (BL and BLB) in the supplemental memory array during a write-to-memory time interval and vice versa during a read-from-memory time interval.

Notwithstanding the above described buffer memory devices, there still exists a need to develop high speed buffer memory devices having expanded functionality, increased data capacity and reduced unit cell size.

SUMMARY OF THE INVENTION

An integrated circuit memory device according to an embodiment of the present invention includes a quad-port cache memory device and an embedded memory device therein. These devices operate collectively as high speed buffer memory devices having fast fall through capability and extended data capacity, for example. These devices also do not require complex arbitration circuitry to oversee reading and writing operations.

The quad-port cache memory device may comprise a data input register having an input electrically coupled to a first port of the cache memory device and an output electrically coupled to a second port of the cache memory device. A multiplexer is also provided. This multiplexer is responsive to at least one select signal and has a first input electrically coupled to the output of the data input register and a second input electrically coupled to a third port of the cache memory device. The quad-port cache memory device also preferably includes an output register having an input electrically coupled to an output of the multiplexer and an output electrically coupled to a fourth port of the cache memory device. Retransmit capability may also be provided by including a retransmit register within the quad-port cache. This retransmit register preferably has an input electrically coupled to the first port and an output electrically coupled to a third input of the multiplexer. The at least one select signal may include three (3) select signals, for example. These select signals may be a retransmit path select signal, a memory path select signal and a direct path select signal. The data input register, the output register and the retransmit register are also preferably responsive to write address, a read address and a retransmit address, respectively. The embedded memory device may comprise a SRAM memory array, for example, and the array may have a write port electrically coupled to the second port of the cache memory device and a read port electrically coupled to the third port of the cache memory device.

Another embodiment of the present invention includes tri-port or other multi-port cache memory devices. Such devices may comprise a data input register having an input electrically coupled to a first port of the cache memory device and a multiplexer that is responsive to a direct path select signal and a memory path select signal. The multiplexer may also have a first input electrically coupled to an output of the data input register and a second input electrically coupled to a second port of the cache memory device. An output register is also provided. This output register has an input electrically coupled to an output of the multiplexer and an output electrically coupled to a third port of the cache memory device. Here, the second port of the cache memory device may by a bidirectional port and the first input of the multiplexer may be electrically coupled by a pass gate device (e.g., CMOS transmission gate) to the bidirectional port. The pass gate device may be responsive to a read/write control signal. An embedded DRAM memory array may also be electrically coupled to the bidirectional port.

A still further embodiment of the present invention includes a multi-port memory device bit cell. This bit cell may comprise an input register and a first retransmit register having an input electrically coupled to an input of the input register. This first retransmit register may comprise a retransmit from zero register. A multiplexer may also be provided. This multiplexer may have a first input electrically coupled to an output of the input register and a second input electrically coupled to an output of the first retransmit register. An output register may also be provided along with a second retransmit register. In particular, the output register may have an input electrically coupled to an output of the multiplexer and the second retransmit register may have an input electrically coupled to an output of the output register and an output electrically coupled to a third input of the multiplexer. The second retransmit register may constitute a retransmit from mark (RTM) register. The multiplexer may also be responsive to a retransmit from zero path select signal, a direct path select signal and a retransmit from mark path select signal.

Additional embodiments of the present invention include methods of operating a FIFO buffer memory device having an embedded memory device and a plurality of multi-port cache memory devices therein. These methods include the operations of reading a first page of data from a first multi-port cache memory device during a first read time interval and reading a second page of data from a second multi-port cache memory device during a second read time interval that follows that first time interval. Arbitration operations are also performed during these reading operations in order to make additional pages of data available for reading without interruption. In particular, prior to termination of the second read time interval, an arbitration operation is performed to determine whether a page of next-to-read data relative to the second page of data is available in the embedded memory device. Then, if the page of next-to-read data is available, an operation is performed to transfer the page of next-to-read data from the embedded memory device to the first multi-port cache memory device during the second read time interval. Operations may also be performed to write data into the second multi-port cache memory during the first and/or second read time interval and then transfer this page of data from the second multi-port cache memory device to the embedded memory device during the second read time interval.

BRIEF DESCRIPTION OF THE INVENTION

FIG. 9 is a flow-diagram of operations that illustrate preferred methods of reading from buffer memory devices.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
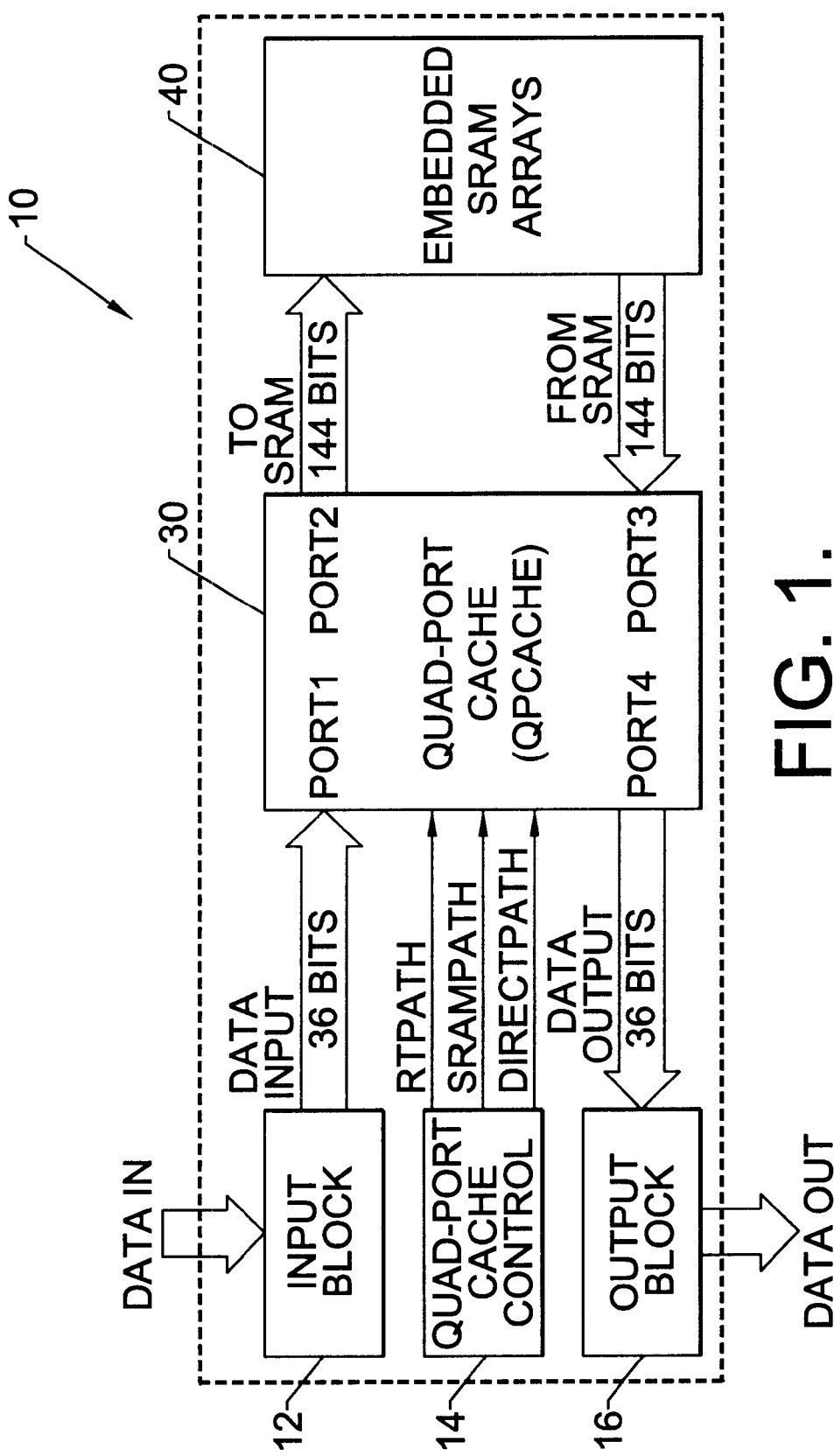
FIG. 1 is a block diagram of a buffer memory device according to a first embodiment of the present invention.

Referring now to FIG. 1, a preferred buffer memory device 10 according to a first embodiment of the present invention comprises a multi-port cache and an embedded memory array 40. The illustrated multi-port cache comprises a quad-port cache 30 (QPCACHE) having a first port that receives data (e.g., write data) from an input block 12 and a fourth port that transfers data (e.g., read data) to an output block 16. The second and third ports of the quad-port cache 30 are coupled to write and read ports of an embedded memory array 40 (e.g., SRAM array), respectively. As illustrated, the quad-port cache 30 is responsive to a plurality of control signals that are generated by a quad-port cache control circuit 14. These control signals, which are provided to the select inputs of a data multiplexer within the quad-port cache 30, include a retransmit path signal (RTPATH), an embedded memory path signal (SRAMPATH) and a direct path signal (DIRECTPATH).

The buffer memory device 10 of FIG. 1 may be operated as an extended capacity first-in first-out buffer (FIFO). In particular, the quad-port cache 30 may comprise a high-speed memory device having fast fall-through capability and moderate capacity, and the embedded memory array 40 may comprise a relatively slower but more highly integrated memory device having a much greater storage capacity. As described more fully hereinbelow, input data can be provided to the input block 12 and then passed to the first port of the quad-port cache 30 as a sequence of N-bit words. A plurality of these N-bit words may then be passed in parallel from the second port of the quad-port cache 30 to the embedded memory array 40 as respective pages of write data. During a read operation, a selected page of memory may also be passed from the embedded memory array 40 to the third port of the quad-port cache 30. Portions of the selected page of memory may then be passed from the fourth port of the quad-port cache 30 to the output block 16 as N-bit words. Fast fall-through performance may also be achieved by immediately accessing data written into the quad-port cache 30 during a following read operation.

Figure 2:
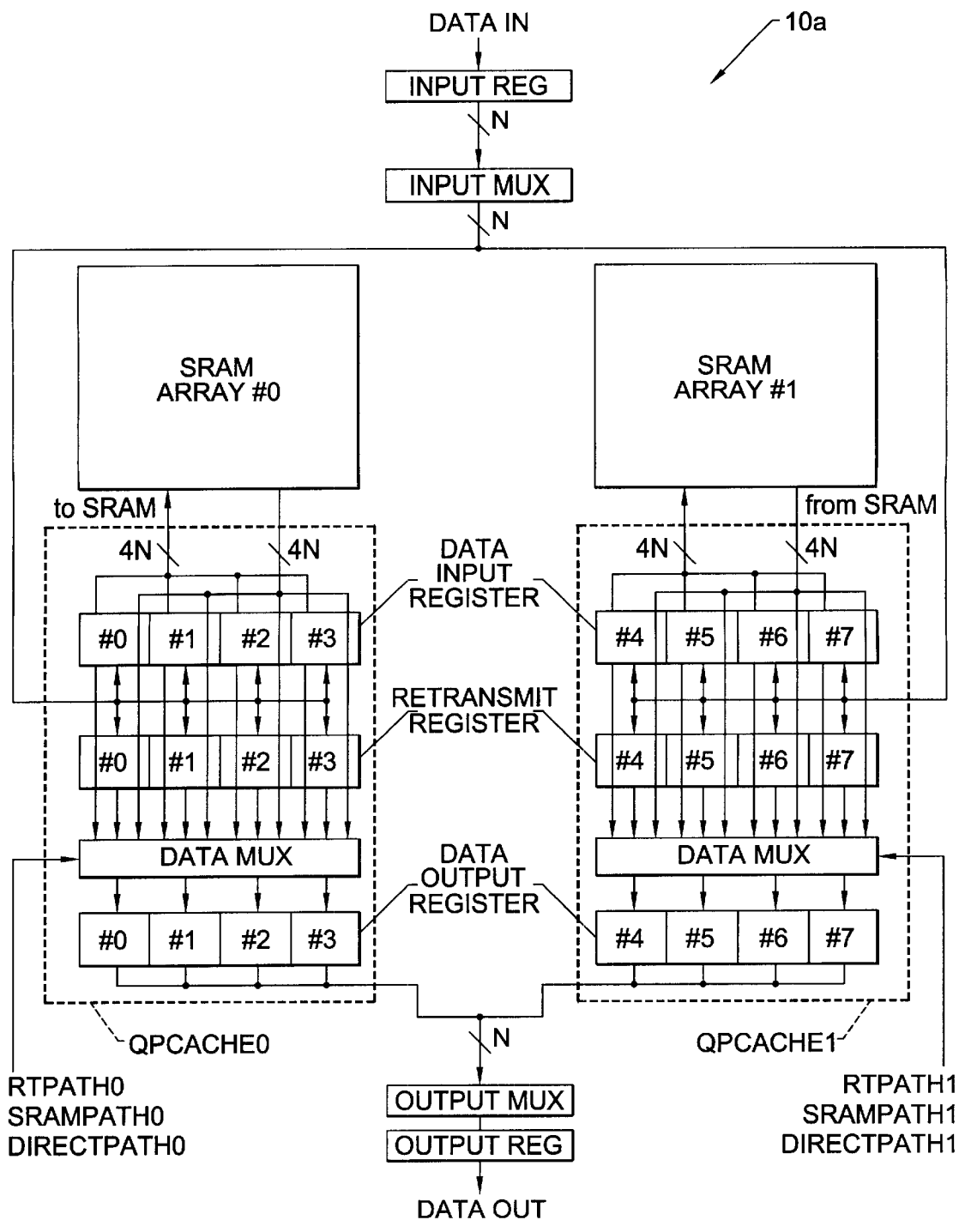
FIG. 2 is a detailed block diagram of a multi-bank buffer memory device according to a second embodiment of the present invention.
Figure 3:
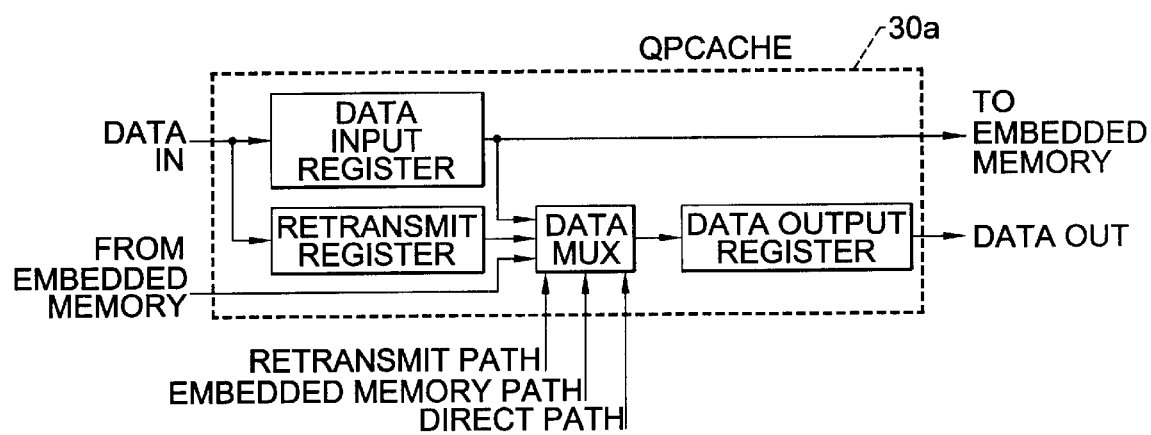
FIG. 3 is a block diagram of a cache bit cell according to a third embodiment of the present invention.
Figure 4:
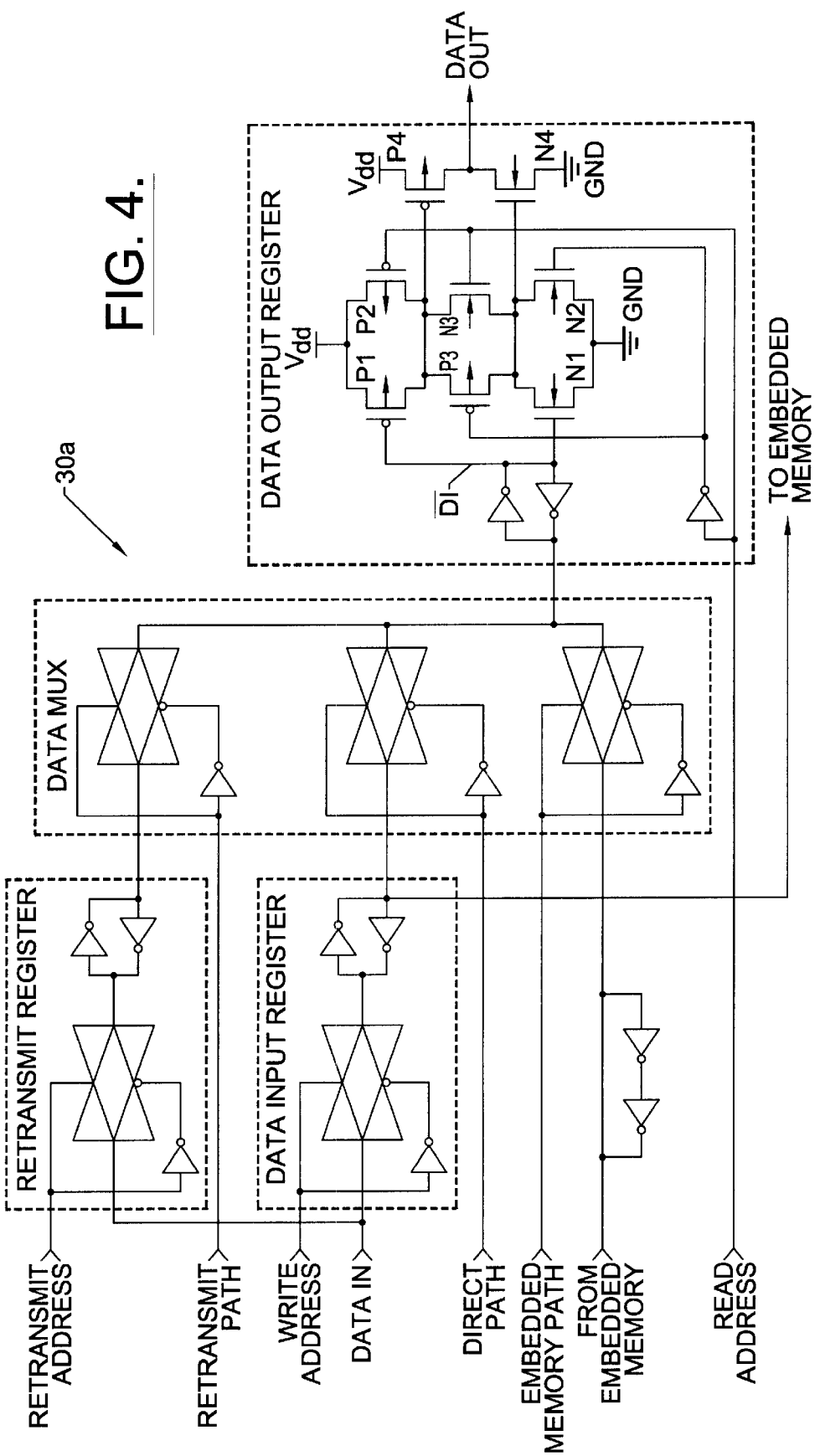
FIG. 4 is a detailed electrical schematic of the cache bit cell of FIG. 3.

As illustrated by FIGS. 2–4, the quad-port cache 30 and the embedded memory 40 of FIG. 1 may be used within a multi-bank buffer memory device 10a. In particular, FIG. 3 illustrates a block diagram of a preferred quad-port cache bit cell 30a used in the multi-bank buffer memory device 10a of FIG. 2. FIG. 4 is a detailed electrical schematic of the cache bit cell 30a of FIG. 3. The bit cell 30a of FIG. 3 comprises a multiplexer (DATA MUX) having a plurality of select inputs that are individually selected in response to a plurality of control signals. These control signals include a retransmit path signal (RETRANSMIT PATH), an embedded memory path signal (EMBEDDED MEMORY PATH) and a direct path signal (DIRECT PATH). A plurality of registers are also provided, including a data input register, a retransmit register and a data output register. The data input register receives and latches input data, upon application of an appropriate write address. The retransmit register also receives and latches initial input data, upon application of an appropriate retransmit address. The retransmit address may be applied upon commencement of write operations that follow a reset or power-up operation, for example. Accordingly, the data written to the retransmit register may be available for immediate retransmission of data stored during earlier write operations. The use of a retransmit register obviates the need to perform time consuming operations to fetch initial data from the embedded memory array 40, when a retransmit request is received by the buffer memory device 10a. This retransmit request, which is frequently referred to as a "retransmit from zero" request, may be generated by a peripheral device that is communicating with the buffer memory device 10a. A data output register is also provided within the quad-port cache bit cell 30a. Depending on the state of the control signals, the data output register can be provided with (i) read data from the embedded memory, (ii) retransmit data from the retransmit register or (iii) write data stored within the data input register.

As illustrated by the detailed electrical schematic of FIG. 4, the signal lines on which the control signals are received are connected to respective transmission gates within the multiplexer (DATA MUX). The data output register has an input electrically connected to an output of the multiplexer. The data output register is also responsive to a read address. A pair of inverters connected in antiparallel at the data input of the output register operate to generate a latched complementary data input signal $\overline{DI}$ which is provided to a gate of PMOS pull-up transistor P1 and NMOS pull-down transistor N1. The read address is also provided to a gate of PMOS pull-up transistor P2 and a gate of intermediate NMOS transistor N3. The data output register also generates a complementary read address that is provided to a gate of intermediate PMOS transistor P3 and NMOS pull-down transistor N2, as illustrated. A tri-state output buffer stage comprising PMOS pull-up transistor P4 and NMOS pull-down transistor N4 is also provided. The gate of PMOS pull-up transistor P4 is electrically connected to the drains of PMOS pull-up transistors P1 and P2, the drain of intermediate NMOS transistor N3 and the source of the intermediate PMOS transistor P3. The gate of NMOS pull-down transistor N4 is electrically connected to the drains of NMOS pull-down transistors N1 and N2, the drain of intermediate PMOS transistor P3 and the source of intermediate NMOS transistor N3. Based on this configuration of the data output register, the generation of a logic 0 signal at the output of the multiplexer and a logic 1 read address will result in the generation of a logic 1 signal at the output of the data output register (DATA OUT). In particular, the logic 0 signal and logic 1 address will turn on: NMOS pull-down transistor N1, intermediate NMOS transistor N3, intermediate PMOS transistor P3 and PMOS pull-up transistor P4 simultaneously. In contrast, the generation of a logic 1 signal at the output of the multiplexer and a logic 1 read address will result in the generation of a logic 0 signal at the output of the data output register. Finally, the receipt of a logic 0 read address will cause the output of the data output register to enter a high impedance state, regardless of the value of the complementary data input signal $\overline{DI}$.

Referring again to the multi-bank memory device 10a of FIG. 2, input data is initially stored in an input register (INPUT REG) and routed to first and second quad-port caches QPCACHE0 and QPCACHE1 by an input multiplexer (INPUT MUX). The input register may be electrically connected to the input multiplexer by an N-bit wide bus. In the illustrated example, N may equal 36. The first quad-port cache QPCACHE0 is illustrated as containing 4N bit cells, with each bit cell preferably configured as illustrated by FIGS. 3–4. The four groups of bit cells within QPCACHE0 are illustrated as groups #0–#3, with each group comprising 36 bit cells. Similarly, the second quad-port cache QPCACHE1 is illustrated as containing 4N bit cells as well. The four groups of bit cells within QPCACHE1 are illustrated as groups #4–#7.

As more fully described hereinbelow with respect to FIGS. 9–10, writing and reading operations independently toggle back and forth between QPCACHE0 and QPCACHE1. For example, upon start-up or the occurrence of a reset operation, 36-bit words of input data can be written in sequence into the data input registers within groups #0–#3 of the bit cells. During these initial write operations, the input data is also written in sequence into the retransmit registers within groups #0–#3 of the bit cells. This write data may be available immediately for reading by setting the control line RTPATH0 to a logic 1 level and thereby passing the write data to the data output register as the input data is received by QPCACHE0. This output data may then be passed from the data output register to an output multiplexer (OUTPUT MUX) and output register (OUTPUT REG). After four 36-bit words have been written into QPCACHE0, write control is passed to QPCACHE1. The write data within the data input register in QPCACHE0 is also preferably written into the respective embedded memory array (SRAM ARRAY #0) while write operations are being performed in QPCACHE1. Operations to read "recent" data within the data input registers or data previously stored in the embedded SRAM memory arrays may also be performed while operations to write new input data into the data input registers of each quad-port cache are simultaneously being performed.

Figure 5:
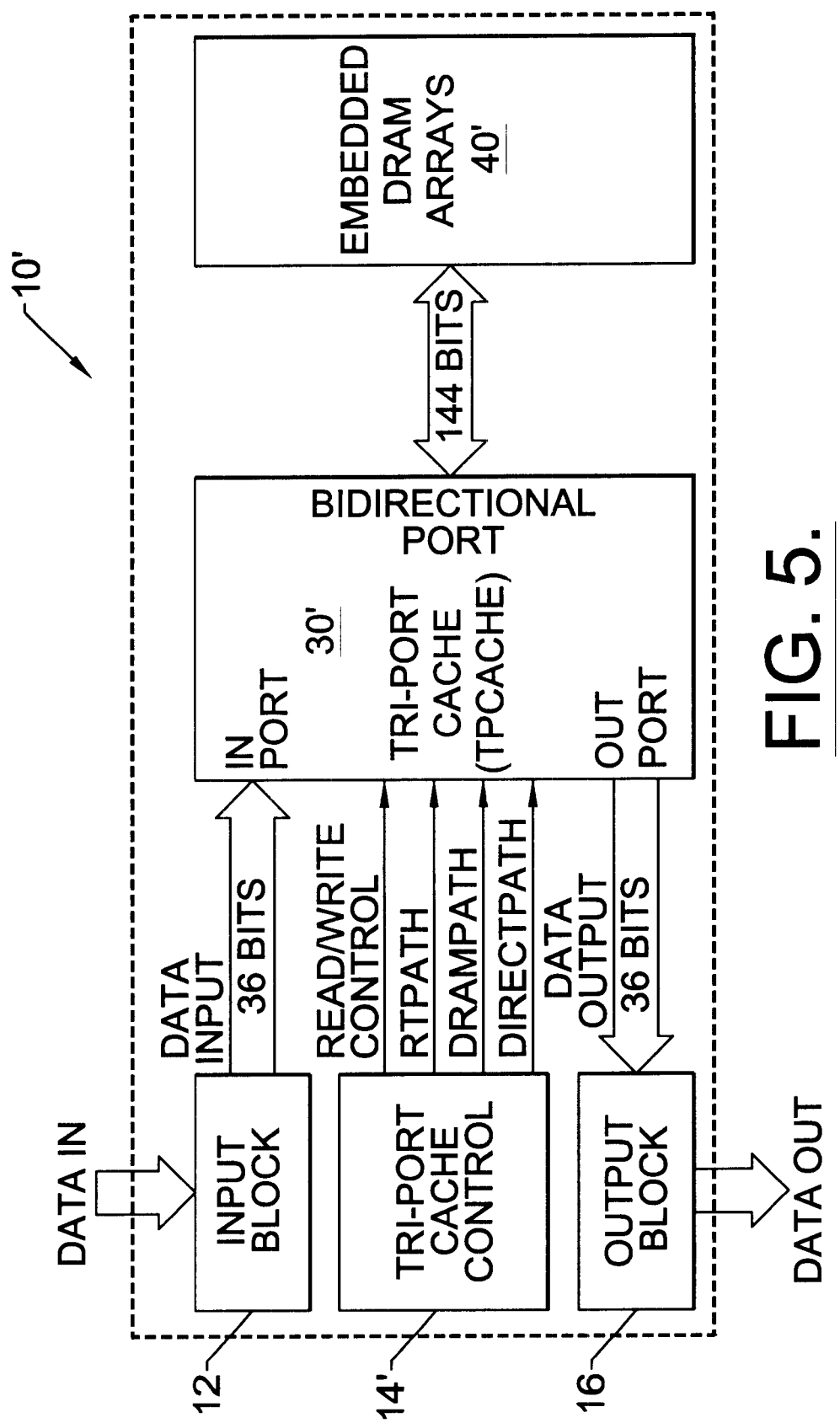
FIG. 5 is a block diagram of a buffer memory device according to a fourth embodiment of the present invention.
Figure 6:
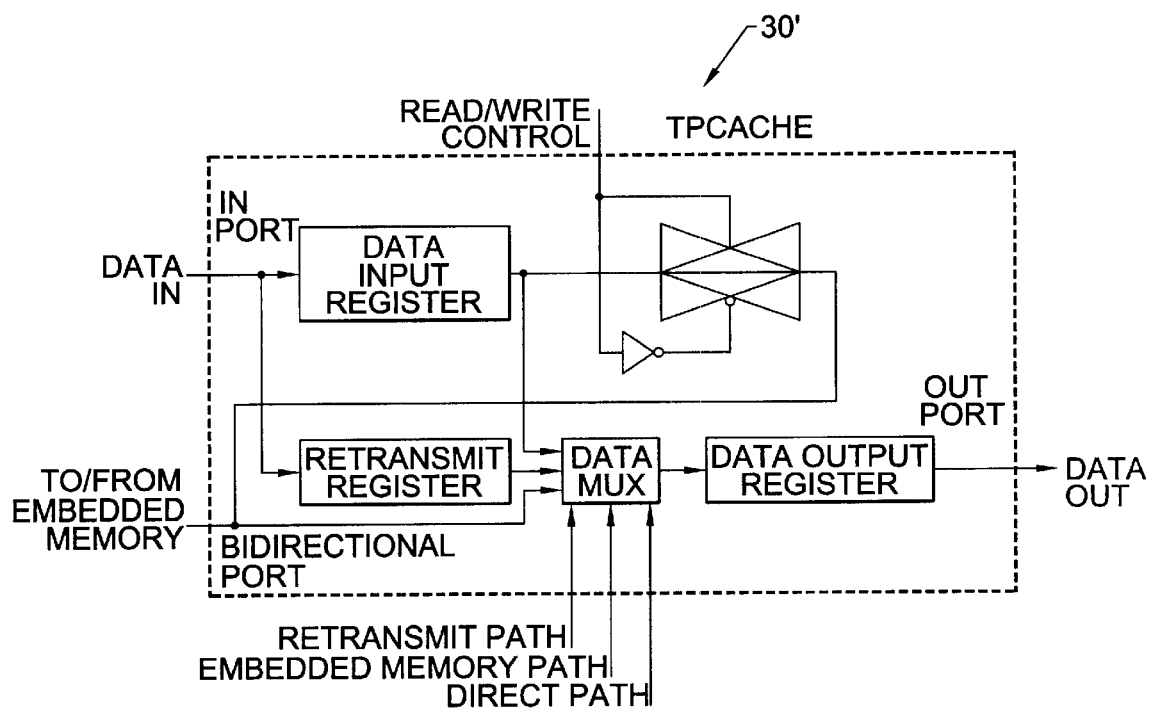
FIG. 6 is a block diagram of a cache bit cell according to a fifth embodiment of the present invention.
Figure 7:
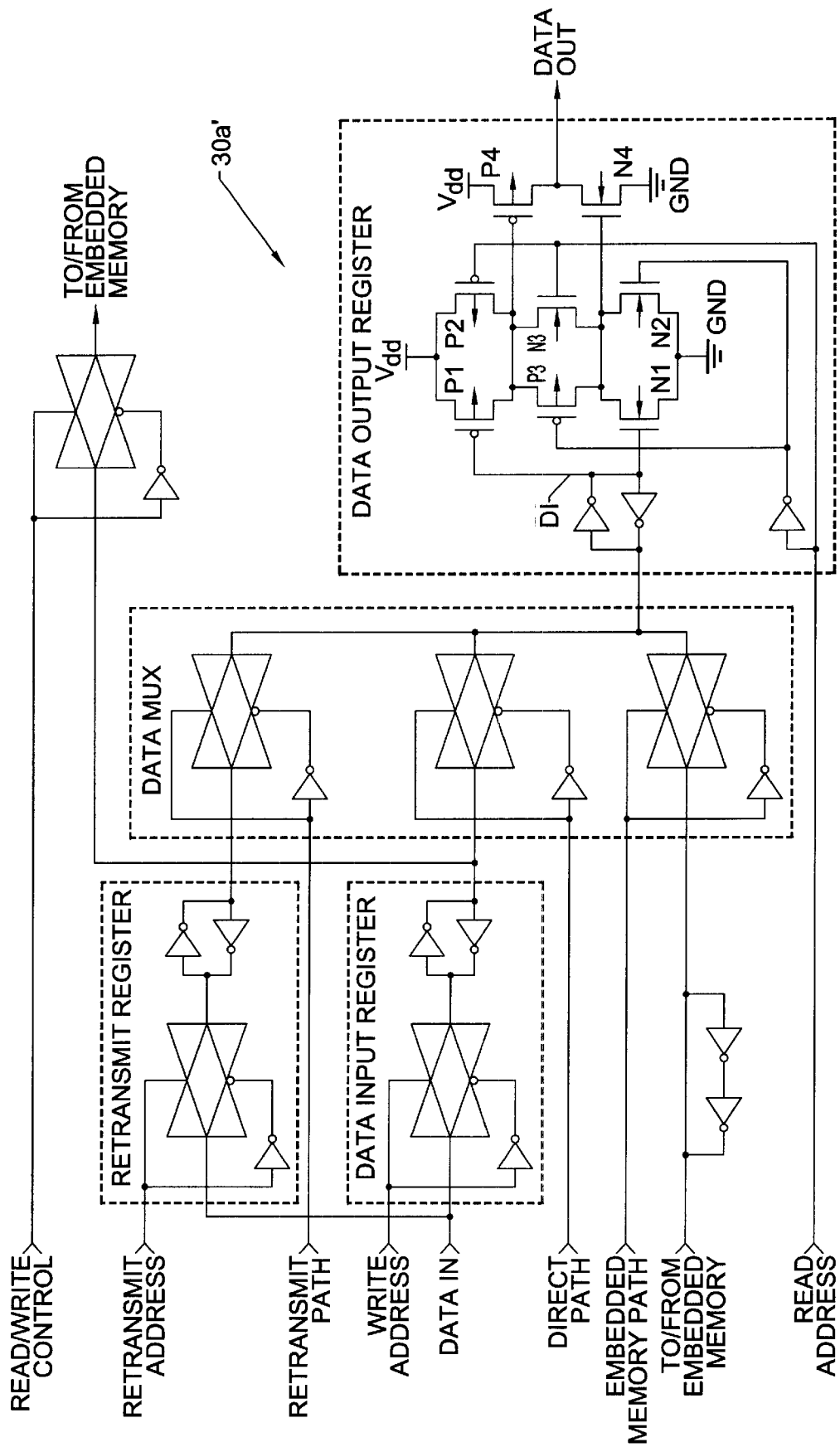
FIG. 7 is a detailed electrical schematic of the cache bit cell of FIG. 6.

Referring now to FIGS. 5–7, a buffer memory device 10' having a preferred tri-port cache 30' therein will be described. The buffer memory device 10' of FIG. 5 includes an input block 12, an embedded memory array 40' (shown as a DRAM array) and an output block 16. A tri-port cache control circuit 14' is also preferably provided. Like the quad-port cache control circuit 14 of FIG. 1, the tri-port cache control circuit 14' generates a plurality of control signals (RTPATH, DRAMPATH and DIRECTPATH) and these control signals are provided to select inputs of a multiplexer within the tri-port cache 30'. Detailed block and electrical schematic diagrams of a bit cell 30a' within the tri-port cache 30' of FIG. 5, are illustrated in FIGS. 6–7. In addition, the tri-port cache control circuit 14' of FIG. 5 generates a read/write control signal, which facilitates proper operation of a bidirectional port and bidirectional bus connecting the tri-port cache 30' to the embedded memory array 40'. The read/write control signal is provided to a transmission gate that blocks data transfer between an output of the data input register and the bidirectional bus during a read operation, but enables data transfer during a write operation when the embedded memory array 40' is set in a mode to accept a page of write data from the bidirectional bus. This transmission gate is illustrated as a CMOS transmission gate in FIGS. 6–7.

Figure 8A:
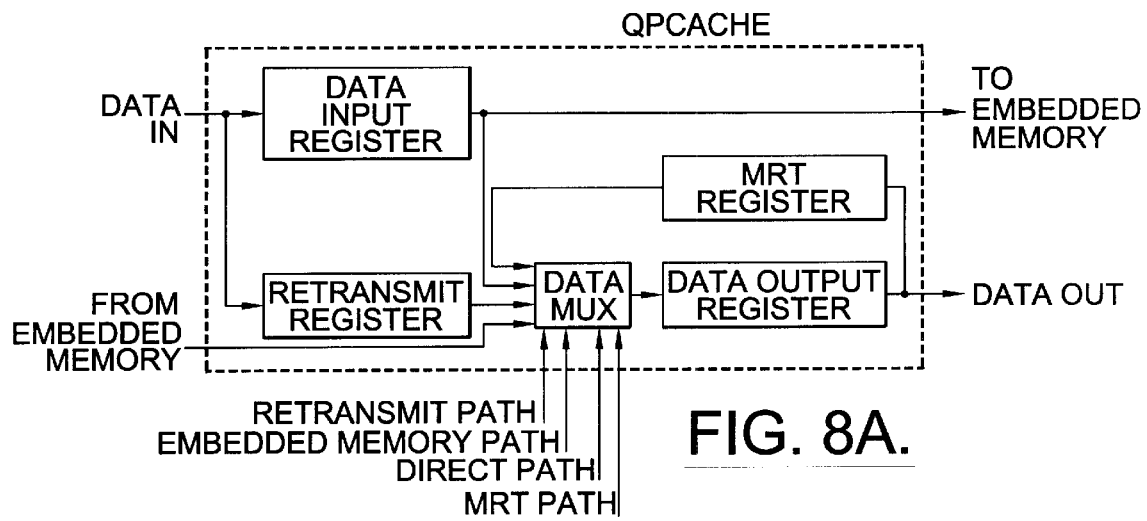
FIG. 8A is a block diagram of a quad-port cache bit cell according to a sixth embodiment of the present invention.
Figure 8B:
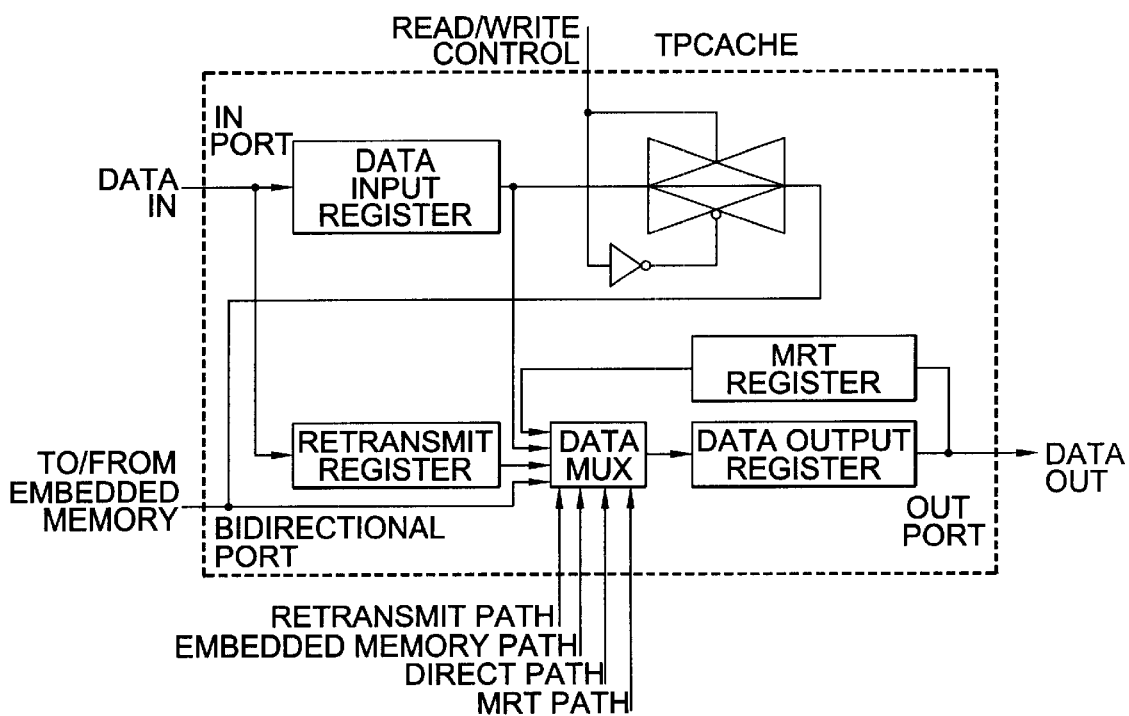
FIG. 8B is a block diagram of a tri-port cache bit cell according to a seventh embodiment of the present invention.

As illustrated by FIGS. 8A and 8B, the quad-port bit cell 30a of FIG. 3 and the tri-port bit cell 30a' of FIG. 6 can both be modified to include a retransmit from "mark" register (MRT register). This MRT register may have an internal structure similar to the retransmit register of FIG. 4 or 7. This MRT register can be utilized within a preferred multi-port cache described herein, to store multiple data words (e.g., a page) following a mark request generated by a processor (not shown). This data can therefore be immediately available for retransmission through the data multiplexer and output register when a retransmit from mark (RFM) request is received by a buffer memory device containing the illustrated bit cells of FIGS. 8A–8B. The transfer of data from the output of the MRT register to an input of the data output register is enabled by setting the MRT PATH signal to a logic 1 level and thereby turning on a CMOS transmission gate within the data multiplexer.

FIG. 9 is a flow-diagram that illustrates preferred operations 50 that can be used when reading data from the multi-port buffer memory device of FIG. 2. Upon reset or receipt of a retransmit request signal (e.g., "retransmit from zero" signal), operations 52 may be performed to activate the first quad-port cache (QPCACHE0) and disable the direct path signals DIRECTPATH0 and DIRECTPATH1 (e.g., set to logic 0 levels). The embedded memory path signals (SRAMPATH0 and SRAMPATH1) are also disabled, but the retransmit path signals (RTPATH0 and RTPATH1) are enabled (e.g., set to logic 1 levels). These initial operations place the buffer memory device in a mode, which enables data to be read from the retransmit registers. This data may comprise data that was written into the retransmit registers after the reset signal was received or data that was initially written into the retransmit registers during an active time period preceding generation of the retransmit request signal.

As illustrated by Blocks 54 and 56, a read data path is provided through the data multiplexer and the data output register within QPCACHE0 until all 144 bits of data (i.e., four 36-bit words) have been read from the retransmit register within QPCACHE0. However, once all initial 144 bits of data have been read from QPCACHE0, a check is made to determine whether a "less than three" flag is active, Block 58. This flag is active whenever a difference between the value of the write pointer (not shown) and a read pointer (not shown) in the embedded memory is less than three (3). Stated alternatively, an operation is performed at Block 58 to determine whether an additional page of data relative to the cache data (i.e., the data available for reading within QPCACHE0 and QPCACHE1) is available in the embedded memory array SRAM ARRAY #0. If the <3 flag is active, then the additional page of data is not available and the direct path signal DIRECTPATH0 is set to a logic 1 level and the signal RTPATH0 is made inactive, as illustrated by Block 60. This operation enables data written into the data input register within QPCACHE0 to be available for reading after the data within QPCACHE1 has been read. However, if an additional page of data is available in the embedded memory SRAM ARRAY #0, then a fetch (i.e., read) operation is performed from SRAM ARRAY #0 and signal SRAM-PATH0 is set to a logic 1 level, Block 62. Signal RTPATH0 is also made inactive since the initial data within the retransmit register within QPCACHE0 has been completely read out.

Read control is then passed to QPCACHE1 and, as illustrated by Blocks 64 and 66, a continuous check is then made to determine whether all 144 bits of read data within the retransmit register in QPCACHE1 have been read. If all 144 bits have been read, then the <3 flag is checked again to determine whether an additional page of data relative to the current data in QPCACHE0 and QPCACHE1 is available in the embedded memory SRAM ARRAY #1, Block 68. If the <3 flag is active, which means an additional page of data is not available, the signal DIRECTPATH1 is set to an active level and signal RTPATH1 is made inactive, Block 70. However, if the <3 flag is not active, signal SRAMPATH1 is set to a logic 1 level, a fetch operation is performed from SRAM ARRAY #1 and signal RTPATH1 is made inactive, Block 72. Read control is then passed back to QPCACHE0 and operations commence to read data from either the data input register or from SRAM ARRAY #0. As illustrated by FIG. 9, these operations continue to toggle back and forth between QPCACHE0 and QPCACHE1 until the next reset or retransmit signal is received.

Figure 10:
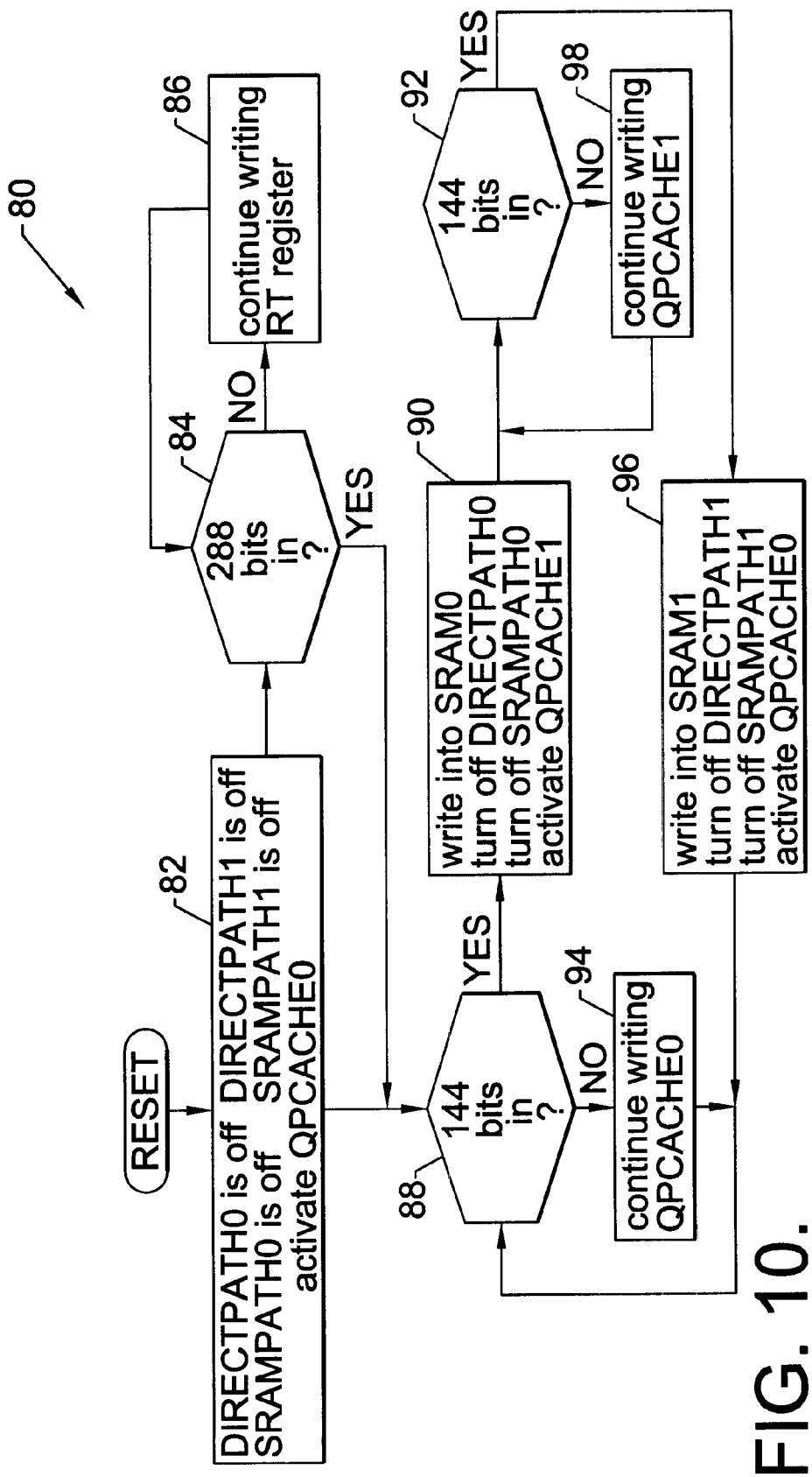
FIG. 10 is a flow-diagram of operations that illustrate preferred methods of writing to buffer memory devices.

The operations 80 of FIG. 10 for writing data to the multi-port buffer memory device of FIG. 2 may be less complex than the reed operations illustrated by FIG. 9 because extensive write arbitration operations are typically not required to determine where subsequent write data is to be stored. This is because the next-to-write "register" is always the data input register of the cache which is not receiving current write data. In contrast, multi-port memory devices that may utilize more extensive read and write arbitration operations to determine next-to-write and next-to-read registers on a continuous basis and also perform fetching operations to an embedded memory are more fully described in commonly assigned U.S. application Ser. No. 09/082,893 to Chin et al. entitled "Methods of Controlling Memory Buffers Having Tri-Port Cache Arrays Therein," filed May 21, 1998, now U.S. Pat. No. 6,216,205, the disclosure of which is hereby incorporated herein by reference.

Referring now to Block 82 of FIG. 10, upon reset, QPCACHE0 is activated to receive write data. Operations are also performed to disconnect the outputs of the data input registers within QPCACHE0 and QPCACHE1 from their respective output registers. This is done by inactivating DIRECTPATH0 and DIRECTPATH1. In addition, the data paths stemming from the embedded memory are also disconnected by inactivating SRAMPATH0 and SRAMPATH1. As illustrated by Blocks 84 and 86, retransmit addresses are applied to QPCACHE0 and QPCACHE1 to enable the storing of the first two pages (e.g., 288 bits) of write data in the retransmit registers. After the first two pages of write data have been stored in the retransmit registers, application of the retransmit addresses is disabled until a subsequent retransmit or reset request has been received. While the operations are being performed to write data into the retransmit registers, write data is also stored in the data input registers within QPCACHE0 and QPCACHE1. For example, at Blocks 88 and 94, data is initially written into QPCACHE0. Once an entire page of data has been written into QPCACHE0, an operation is performed to transfer the page of write data to the embedded memory (i.e., SRAM ARRAY #0) and control is passed to QPCACHE1, Block 90. Write operations are then performed by QPCACHE1 until another page of data has been received, Blocks 92 and 98. As illustrated by Block 96, the page of data within QPCACHE1 is then passed to the embedded memory (i.e., SRAM ARRAY #1) and write control is passed back to QPCACHE0. This back and forth toggling between QPCACHE0 and QPCACHE1 continues until a next reset operation is received.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A buffer memory device, comprising:
   a first quad-port cache memory device;
   a second quad-port cache memory device;
   an input bus electrically coupled to a first unidirectional input port of said first quad-port cache memory device and a first unidirectional input port of said second quad-port cache memory device;
   a first embedded memory array having a write port and a read port electrically coupled to a second unidirectional output port and third unidirectional input port of said first quad-port cache memory device, respectively;
   a second embedded memory array having a write port and a read port electrically coupled to a second unidirectional output port and a third unidirectional input port of said second quad-port cache memory device, respectively; and
   an output bus electrically coupled to a fourth unidirectional output port of said first quad-port cache memory and a fourth unidirectional output port of said second quad-port cache memory.

2. The buffer memory device of claim 1, wherein said first quad-port cache memory device comprises a multiplexer having a first and second inputs electrically coupled to the write port and the read port of said first embedded memory array, respectively.

3. The buffer memory device of claim 1, wherein said first quad-port cache memory device comprises:
   a data input register having an input electrically coupled to the corresponding first unidirectional input port and an output electrically coupled to the corresponding second unidirectional output port;
   a multiplexer responsive to at least one select signal, said multiplexer having a first input electrically coupled to the output of said data input register and a second input electrically coupled to the corresponding third unidirectional input port; and
   an output register having an input electrically coupled to an output of said multiplexer and an output electrically coupled to the corresponding fourth unidirectional output port.

4. The buffer memory device of claim 3, wherein said first quad-port cache memory device further comprises a retransmit register having an input electrically coupled to the corresponding first unidirectional input port and an output electrically coupled to a third input of said multiplexer.

5. The memory device of claim 4, wherein said multiplexer is responsive to a retransmit path select signal, a memory path select signal and a direct path select signal.

6. The memory device of claim 5, wherein said data input register, said output register and said retransmit register are responsive to a write address, a read address and a retransmit address, respectively.

7. A multi-port cache memory device, comprising:
a data input register having an input electrically coupled to a first input port of the cache memory device;
a multiplexer responsive to a direct path select signal and a memory path select signal, said multiplexer having a first input electrically coupled to an output of said data input register, and a second input electrically coupled by a pass gate device to a second bidirectional port of the cache memory device; and
an output register having an input electrically coupled to an output of said multiplexer and an output electrically coupled to a third output port of the cache memory device.

8. The memory device of claim 7, wherein the pass gate device is responsive to a read/write control signal.

9. The memory device of claim 8, wherein the pass gate device comprises a CMOS transmission gate.

10. The memory device of claim 7, wherein said output register is responsive to a read address.

11. The memory device of claim 7, further comprising a DRAM memory array electrically coupled to the second bidirectional port.

12. The memory device of claim 7, wherein said output register has an address input that is configured to receive a read address.

13. A multi-port cache memory device, comprising:
a data input register having an input electrically coupled to a first port of the cache memory device;
a multiplexer responsive to a direct path select signal and a memory path select signal, said multiplexer having a first input electrically coupled to an output of said data input register and a second input electrically coupled to a second port of the cache memory device; and
an output register having a data input electrically coupled to an output of said multiplexer, an address input that is configured to receive a read address and an output electrically coupled to a third port of the cache memory device;
wherein said output register generates a complementary data input signal and a complementary read address; wherein said output register comprises first and second NMOS pull-down transistors connected in parallel and first and second PMOS pull-up transistors connected in parallel; wherein the first NMOS pull-down transistor and the first PMOS pull-up transistor are responsive to the complementary data input signal; and wherein the second NMOS pull-down transistor and the second PMOS pull-up transistor are responsive to the complementary read address and the read address, respectively.

14. The memory device of claim 13, wherein said output register comprises:
an intermediate NMOS transistor having a drain connected to a drain of the first PMOS pull-up transistor and a source electrically connected to a drain of the first NMOS pull-down transistor; and
an intermediate PMOS transistor having a drain connected to a drain of the first NMOS pull-down transistor and a source electrically connected to a drain of the first PMOS pull-up transistor.

15. The memory device of claim 14, wherein said intermediate NMOS transistor is responsive to the read address; and wherein said intermediate PMOS transistor is responsive to the complementary read address.

16. A first-in first-out (FIFO) memory device, comprising:
an embedded memory array having a write port and a read port; and
a quad-port cache memory device having a unidirectional data input port, a unidirectional data output port, a first embedded memory port that is electrically coupled to the write port of said embedded memory array and a second embedded memory port that is electrically coupled to the read port of said embedded memory array, said quad-port cache memory device comprising:
a data input register that is responsive to a write address and has a data input electrically coupled to the undirectional data input port and a data output electrically coupled to the first embedded memory port;
a retransmit register that is responsive to a retransmit address and has a data input electrically coupled to the unidirectional data input port;
a multiplexer that is responsive to at least one path select signal and has a first input electrically coupled to the data output of said data input register, a second input electrically coupled to the second embedded memory port and a third input electrically coupled to a data output of said retransmit register; and
a data output register that is responsive to a read address and has a data input electrically coupled to an output of said multiplexer and a data output electrically coupled to the unidirectional data output port.

17. The FIFO memory device of claim 16, wherein said multiplexer is responsive to a retransmit path select signal, an embedded memory path select signal and a direct path select signal.

18. The FIFO memory device of claim 16, wherein said embedded memory array comprises an static random access memory (SRAM) array.

19. A first-in first-out (FIFO) memory device, comprising:
an embedded memory array having a write port and a read port; and
a quad-port cache memory device having a unidirectional data input port, a unidirectional data output port, a first embedded memory port that is electrically coupled to the write port of said embedded memory array and a second embedded memory port that is electrically coupled to the read port of said embedded memory array, said quad-port cache memory device comprising:
a data input register that is responsive to a write address and has a data input electrically coupled to the unidirectional data input port and a data output electrically coupled to the first embedded memory port;
a retransmit register that is responsive to a retransmit address and has a data input electrically coupled to the undirectional data input port;
a multiplexer that is responsive to at least one path select signal and has a first input electrically coupled to the data output of said data input register, a second input electrically coupled to the second embedded memory port and a third input electrically coupled to a data output of said retransmit register;
a data output register that is responsive to a read address and has a data input electrically coupled to an output of said multiplexer and a data output electrically coupled to the unidirectional data output port; and
a retransmit-from-mark register having a data input electrically coupled to the data output port and a data output electrically coupled to a fourth input of said multiplexer.

20. The FIFO memory device of claim 19, wherein said multiplexer is responsive to a retransmit path select signal, an embedded memory path select signal, a direct path select signal and a retransmit-from-mark path select signal.

21. The FIFO memory device of claim 19, wherein said embedded memory array comprises an static random access memory (SRAM) array.

22. A first-in first-out (FIFO) memory device, comprising:
an embedded memory array; and
a multi-port cache memory device having a unidirectional data input port, a unidirectional data output port and an embedded memory port that is electrically coupled to said embedded memory array, said multi-port cache memory device comprising:
 a data input register that is responsive to a write address and has a data input electrically coupled to the unidirectional data input port;
 a retransmit register that is responsive to a retransmit address and has a data input electrically coupled to the unidirectional data input port;
 a multiplexer that is responsive to at least one path select signal and has a first input electrically coupled to a data output of said data input register, a second input electrically coupled to the embedded memory port and a third input electrically coupled to a data output of said retransmit register; and
 a data output register that is responsive to a read address and has a data input electrically coupled to an output of said multiplexer and a data output electrically coupled to the unidirectional data output port.

23. The FIFO memory device of claim 22, wherein said embedded memory array is a static random access memory (SRAM) array or a dynamic random access memory (DRAM) array.

24. The FIFO memory device of claim 23, wherein the embedded memory port is a bidirectional port.

25. The FIFO memory device of claim 22, wherein the embedded memory port is a bidirectional port; and wherein a data output of said data input register is electrically coupled to the embedded memory port by a pass gate device that is responsive to a read/write control signal.

26. The FIFO memory device of claim 22, wherein said multi-port cache memory device further comprises a retransmit-from-mark register having a data input electrically coupled to the data output port and a data output electrically coupled to a fourth input of said multiplexer.

27. A first-in first-out (FIFO) memory device, comprising:
an embedded memory array; and
a multi-port cache memory device having a unidirectional data input port, a unidirectional data output port and a first embedded memory port that is electrically coupled to said embedded memory array, said multi-port cache memory device comprising:
 a data input register that is responsive to a write address and has a data input electrically coupled to the unidirectional data input port;
 a retransmit register that is responsive to a retransmit address and has a data input electrically coupled to the unidirectional data input port;
 a data output register that is responsive to a read address and has a data output electrically coupled to the unidirectional data output port; and
 means, responsive to at least one path select signal, for selectively routing data one-at-a-time from either said data input register, said retransmit register or the first embedded memory port, to said data output register.

28. The FIFO memory device of claim 27, wherein said multi-port cache comprises a second embedded memory port; and wherein the data output of said data input register is electrically coupled to the second embedded memory port.

29. The FIFO memory device of claim 28, wherein said embedded memory array has a write port that is electrically coupled to the second embedded memory port.

30. The FIFO memory device of claim 27, wherein said means for selectively routing data is configured to support routing of read data from the first embedded memory port to said data output register while said data input register is simultaneously receiving write data from the data input port.

31. A first-in first-out (FIFO) memory device, comprising:
an embedded memory array; and
a multi-port cache memory device having a unidirectional data input port, a unidirectional data output port and a first embedded memory port that is electrically coupled to said embedded memory array, said multi-port cache memory device comprising:
 a data input register that is responsive to a write address and has a data input electrically coupled to the unidirectional data input port;
 a retransmit register that is responsive to a retransmit address and has a data input electrically coupled to the unidirectional data input port;
 a data output register that is responsive to a read address and has a data output electrically coupled to the unidirectional data output port;
 a retransmit-from-mark register having a data input electrically coupled to the unidirectional data output port; and
 means, responsive to at least one path select signal, for selectively routing data one-at-a-time from either said data input register, said retransmit register, said retransmit-from-mark register or the first embedded memory port, to said data output register.

32. The FIFO memory device of claim 31, wherein said means for selectively routing data comprises a plurality of CMOS transmission gates that are each responsive to a respective path select signal.

33. The FIFO memory device of claim 31, wherein said means for selectively routing data is configured to support routing of read data from the first embedded memory port to said data output register while said data input register is simultaneously receiving write data from the unidirectional data input port.

34. A first-in first-out (FIFO) memory device, comprising:
an embedded memory array having a write port and a read port; and
a quad-port cache memory device having a unidirectional data input port, a unidirectional data output port, a first embedded memory port that is electrically coupled to the read port of said embedded memory array and a second embedded memory port that is electrically coupled to a write port of said embedded memory array, said quad-port cache memory device comprising:
 a data input register that is responsive to a write address and has a data input electrically coupled to the unidirectional data input port and a data output electrically coupled to the second embedded memory port;
 a data output register that is responsive to a read address and has a data output electrically coupled to the unidirectional data output port; and
 means, responsive to at least one path select signal, for selectively routing data one-at-a-time from either said data input register or the first embedded memory port, to said data output register.

35. The FIFO memory device of claim 34, wherein said means for selectively routing data is configured to support routing of read data from the first embedded memory port to said data output register while said data input register is simultaneously receiving write data from the unidirectional data input port.

* * * * *